United States Patent
Everett

(12) 
(10) Patent No.: US 6,432,747 B1
(45) Date of Patent: Aug. 13, 2002

(54) REPAIR METHOD FOR BROKEN OR MISSING MICROCIRCUIT PACKAGE TERMINAL LEAD

(75) Inventor: James L. Everett, Poway, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/610,063

(22) Filed: Jul. 5, 2000

(51) Int. Cl.⁷ .......................... H01L 21/44; H01L 21/48; H01L 21/50
(52) U.S. Cl. ...................... 438/118; 438/106; 438/107; 438/119; 438/121; 438/125; 257/684; 257/690
(58) Field of Search ................................. 438/111, 107, 438/106, 118, 119, 121, 125; 257/684, 690

(56) References Cited

U.S. PATENT DOCUMENTS

| | | | |
|---|---|---|---|
| 4,953,005 A | * | 8/1990 | Carlson et al. ............... 357/80 |
| 5,049,973 A | * | 9/1991 | Satriano et al. .............. 357/70 |

* cited by examiner

Primary Examiner—Long Pham
Assistant Examiner—Hsien-Ming Lee
(74) Attorney, Agent, or Firm—Harness, Dickey & Pierce, P.L.C.

(57) ABSTRACT

An approach to repairing broken or missing leads of integrated microcircuit assemblies includes the use of a repair enhancement device (30). The enhancement device (30) is welded to an attachment end of a replacement lead (20), where the enhancement device (30) has a larger contact surface area than the attachment end of the replacement lead (20). The enhancement device (30) is then attached to a housing (40) of the microcircuit assembly such that the surface area of the enhancement device (30) provides significant mechanical reinforcement to the replacement lead. Welding the enhancement device (30) to the replacement lead (20) eliminates problems associated with subsequent soldering operations. An attachment region (42) is also etched out of the housing (40) adjacent to a conductive element (44) of the housing, where the conductive element (44) provides a conductive pathway through the housing to the underlying microcircuit. The enhancement device (30) is then aligned with the attachment region (42), and bonded to the conductive element (44) with an electrically conductive adhesive. The etching process further improves mechanical strength.

14 Claims, 3 Drawing Sheets

REPAIR METHOD FOR BROKEN OR MISSING MICROCIRCUIT PACKAGE TERMINAL LEAD

This invention was made with Government support under Contract No. F33657-91-C-0006 awarded by the U. S. Air Force. The Government has certain rights in the invention.

BACKGROUND OF THE INVENTION

1. Field of the Invention

This present invention relates generally to the repair of integrated microcircuit assemblies. More particularly, the present invention relates to a method and device for connecting a replacement lead to an integrated microcircuit housing.

2. Discussion of the Related Art

Integrated microcircuit assemblies typically include one or more microcircuits packaged inside a housing made of a material such as ceramic or plastic. The housing generally has a number of conductive elements providing a conductive pathway through the housing for attachment of leads to the microcircuit. For example, if the housing is made of a ceramic material, the conductive element will often be a via. Similarly, if the housing is made of a plastic material, the conductive element is generally an internal lead frame. In any case, under conventional approaches the leads are electrically connected to the conductive elements and provide a mechanism for connecting the microcircuit assembly to other circuits, systems, and components.

The above-described leads are attached to and/or exit the housing at various angles and configurations, which causes them to be subjected to varying amounts of stress. This stress, or repeated applications of stress, can cause the leads to break off in such a way that makes the microcircuit assemblies very difficult to repair. Commonly, the entire integrated microcircuit assembly is discarded and replaced with one having all leads intact. It is easy to understand that this approach results in increased part costs and production delays. It is therefore desirable to provide a method and device for repairing broken or missing leads of integrated microcircuit assemblies.

Another approach to correcting for broken or missing leads involves replacing the entire housing. This therefore requires removal of the microcircuit or microcircuits from the housing and the insertion of the microcircuits into a new housing. This approach, however, can be labor intensive and generally results in higher manufacturing costs. There is also an increased potential for damaging the microcircuit during either the removal or replacement process. It is therefore desirable to provide a method and device for repairing broken or missing leads of integrated microcircuit assemblies that does not involve replacing the entire housing.

Other conventional approaches involve soldering the broken lead, or a replacement lead, back onto the conductive element. This approach is not always possible, however, due to metallurgy incompatibilities. Even in cases where a lead can be replaced by soldering, it is often very difficult to perform subsequent operations with the integrated circuit assembly because leads attached with solder will often fall off when subjected to heat. Thus, in subsequent soldering applications associated with connecting the integrated microcircuit assembly with other circuits, systems, and components, the replacement lead will often fall off again. This also adds to manufacturing costs and reduces reliability. It is therefore desirable to provide a method and device for connecting a replacement lead to an integrated microcircuit housing that does not involve the above-described soldering process. It is also desirable to provide mechanical reinforcement to the replacement lead so that reliability is improved and manufacturing costs are reduced.

SUMMARY OF THE INVENTION

The above and other objectives are achieved by a method and device in accordance with the present invention for replacing broken or missing integrated microcircuit assembly leads. The method includes the step of providing the replacement lead, where the replacement lead has an attachment end. The attachment end of the replacement lead is welded to an enhancement device, where the enhancement device has a larger contact surface area than the attachment end of the replacement lead. The method further includes the step of attaching the enhancement device to the housing such that the contact surface area of the enhancement device provides mechanical reinforcement to the replacement lead.

Further in accordance with the present invention, a method for attaching a replacement lead enhancement device to an integrated microcircuit housing is provided. The method includes the step of etching an attachment region out of the housing, where the attachment region is located adjacent to a conductive element of the housing. The conductive element provides a conductive pathway through the housing. The enhancement device is then aligned with the attachment region, and bonded to the conductive element with an electrically conductive adhesive.

In another aspect of the invention, a replacement lead assembly for an integrated microcircuit housing includes a replacement lead, and an enhancement device. The enhancement device is welded to an attachment end of the replacement lead. The enhancement device has a larger contact surface area than the attachment end of the replacement lead.

BRIEF DESCRIPTION OF THE DRAWINGS

Additional objects, features and advantages of the present invention will become apparent from the following description and the appended claims when taken in connection with the accompanying drawings, wherein:

DETAILED DESCRIPTION OF THE PREFERRED EMBODIMENTS

Figure 1:
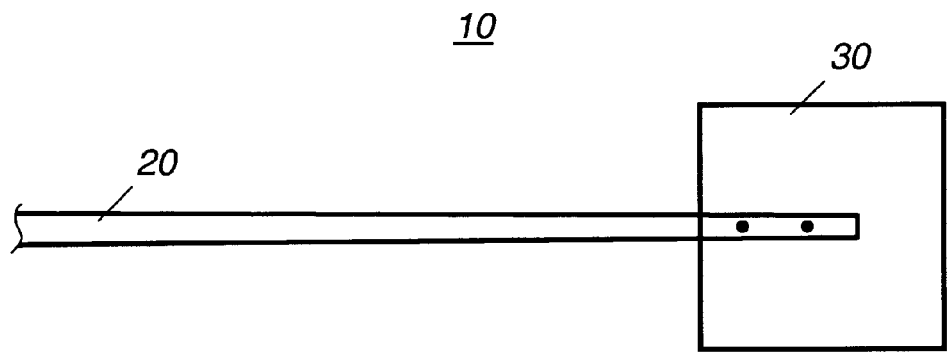
FIG. 1 is a plan view of a replacement lead assembly in accordance with the present invention.

FIG. 1 shows a replacement lead assembly 10 for an integrated microcircuit housing in accordance with a preferred embodiment of the present invention. The assembly 10 includes a replacement lead 20 and an enhancement device 30 such as a tab with a planar geometry. The replacement lead 20 may be fabricated from any electrical wire of appropriate size, and in some cases the severed (or broken) lead may be used as the replacement lead. In particular, magnet wire (or coil wire) provides particularly satisfying performance due to its ease of welding and malleability. Furthermore, if insulated wire is used for the replacement lead 20, the insulation can be removed at the attachment end, and retained over the remainder of the wire.

The enhancement device 30 is welded to the attachment end of the replacement lead 20. While welding is the preferred mechanism for attaching the enhancement device 30 to the lead 20, a high-temperature solder may also be used. It is preferred that the enhancement device 30 is some sort of tab, and in the highly preferred embodiment, the enhancement device 30 is made from gold plated molybdenum. This type of tab is commonly referred to as a molytab. The characteristics of a molytab make it particularly suitable for this application, since it is quite compatible with the weld process used to attach the replacement lead 20. It is important to note that the enhancement device 30 is welded to the replacement lead 20, since this provides the robustness and ability to withstand subsequent operations such as soldering the repaired integrated microcircuit assembly to other circuits, systems, and components. It is also important to note that the enhancement device 30 has a larger contact surface area than the attachment end of the replacement lead 20. The contact surface area for the enhancement device 30 is defined as the area contacting a housing (to be described below), and is preferably on the order of 15×15 mils. It will be appreciated that the cylindrical geometry of the replacement lead 20 provides a substantially smaller contact surface area than the planar geometry of the enhancement device 30. It is important to note that while the preferred enhancement device 30 is a tab with a planar geometry, any geometric shape providing a larger contact surface area can be used. The larger surface area provides improved mechanical reinforcement to the replacement lead 20 before, during, and after attachment to the housing.

Figure 2:
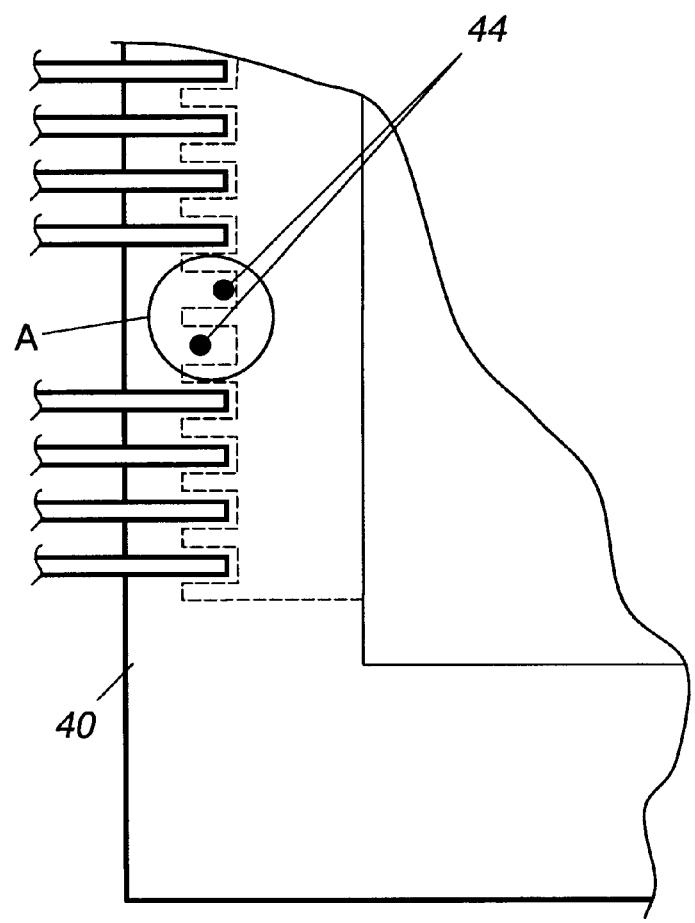
FIG. 2 is a plan view of an integrated microcircuit assembly housing with broken or missing leads.

The method for connecting the replacement lead 20 to an integrated microcircuit assembly housing will now be described in greater detail. Turning now to FIG. 2, a plan view of an integrated microcircuit assembly housing 40 is shown with two broken or missing leads. It will be appreciated that the present invention can be readily applied to a greater or fewer number of broken leads than shown.

Figure 3:
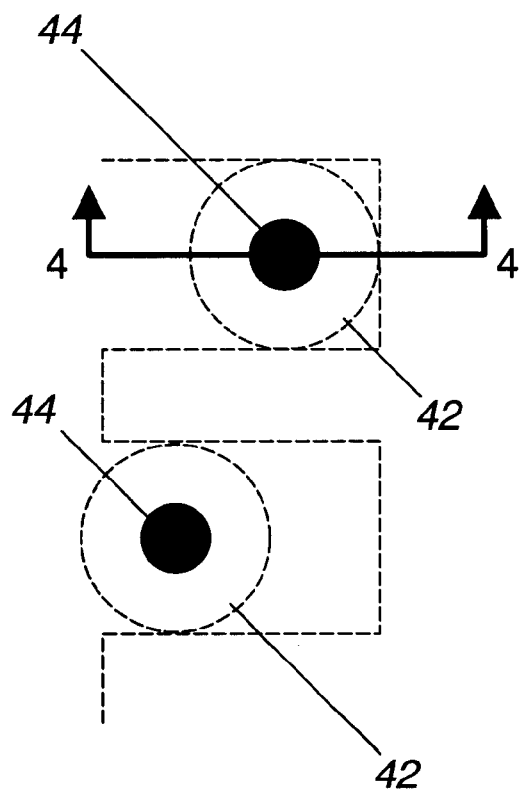
FIG. 3 is an enlarged view of area A shown in FIG. 2.
Figure 4:
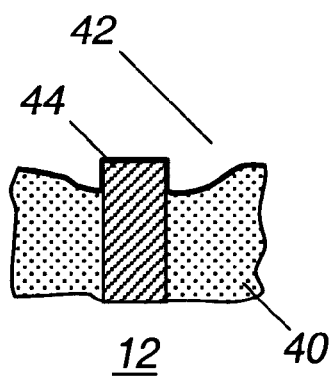
FIG. 4 is a cross-sectional view taken along lines 4—4 in FIG. 3.

As shown in FIGS. 3 and 4, the method includes the step of etching an attachment region 42 out of the housing 40, where the attachment region 42 is located adjacent to a conductive element 44 of the housing 40. As already discussed, the conductive element 44 provides a conductive pathway through the housing 40 to a microcircuit 12. It will be appreciated that the conductive element 44 often has no protrusion from the package surface, or has a very small diameter, which necessitates the etching process. This leaves the conductive element 44 exposed for subsequent connection with the enhancement device 30. It is preferred that the attachment region 42 surround the conductive element 44 to provide a larger and uneven attachment surface. Etching around the conductive element 44 can be achieved by any number of techniques well known in the art. The method further provides for aligning the enhancement device 30 (FIG. 1) with the attachment region 42. This allows the enhancement device 30 to be bonded to the conductive element 44 with an electrically conductive adhesive such as a gold epoxy. It will further be appreciated that the replacement lead assembly 10 is held in place by well-known approaches while the electrically conductive adhesive cures. As already discussed, the conductive element 44 can be either a via (in the case of a ceramic housing) or an internal lead frame (in the case of a plastic housing).

Figure 5:
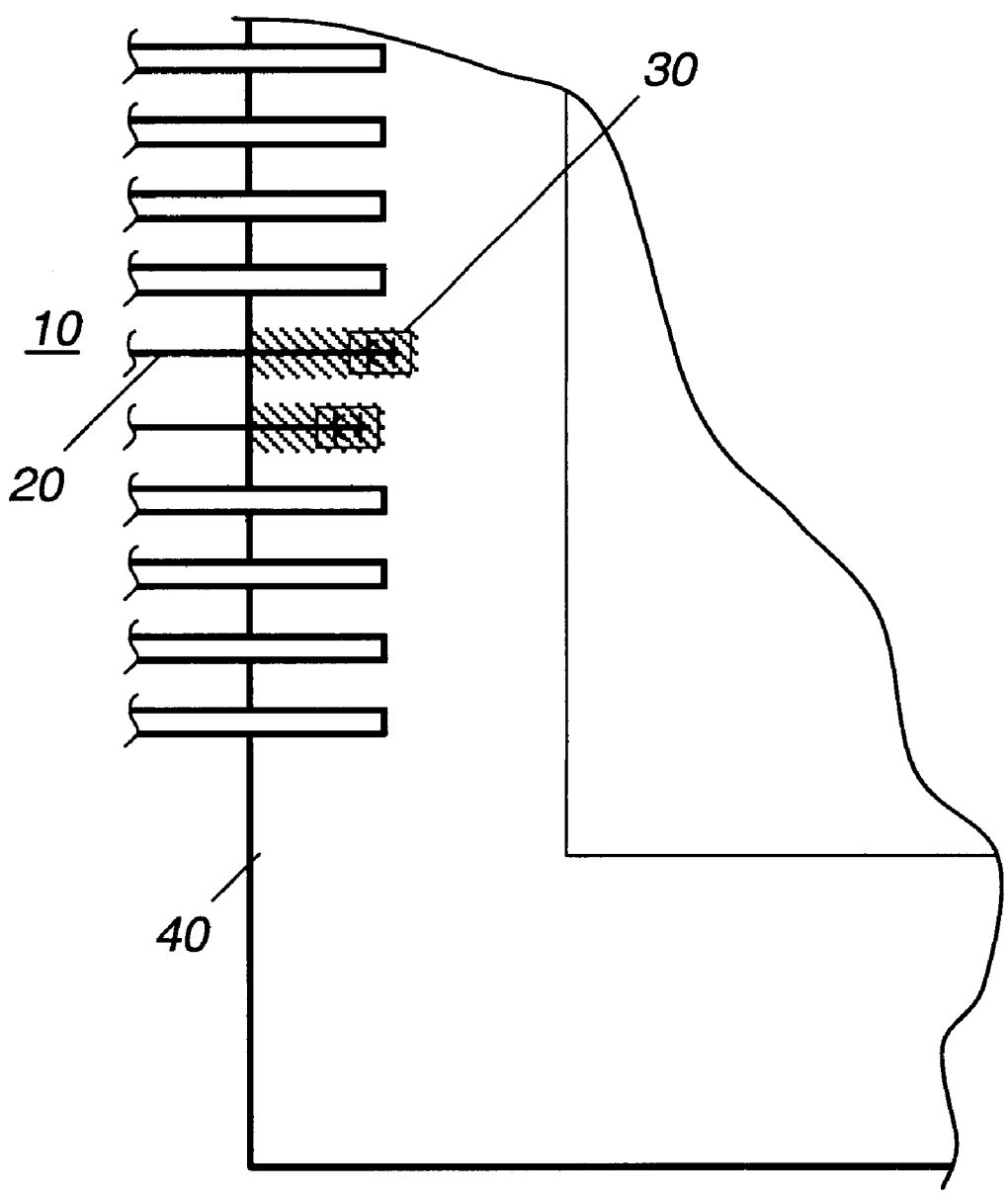
FIG. 5 is a plan view of an integrated microcircuit assembly after replacement lead enhancement devices have been attached in accordance with the present invention.

FIG. 5 demonstrates the additional step of over-coating the replacement lead 20 and the enhancement device 30 with a structural adhesive. The structural adhesive is preferably a non-conducting or insulating material such as commercially available 84-3 (Ablestik Laboratories), and provides strength and robustness. After assembly is complete, the replacement lead 20 can be formed into a shape which emulates the original lead shape, resulting in a device which may readily be returned to service.

The present invention therefore provides an approach to dealing with broken leads of integrated microcircuit assemblies that does not fall subject to the pitfalls commonly associated with conventional approaches. For example, the integrated microcircuit assemblies no longer need to be discarded, which reduces part costs and significantly enhances production cycle times. Furthermore, the entire housing need not be replaced under the present invention. Thus, manufacturing costs are reduced and damage to the underlying microcircuit is minimized. Additionally, welding eliminates the problems associated with subsequent soldering operations. The additional contact surface area provided by the enhancement device also improves mechanical strength, durability, and reliability of the integrated microcircuit assembly.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for connecting a replacement lead having an attachment end to an integrated microcircuit assembly housing, the method comprising the steps of:

welding the attachment end of the replacement lead to an enhancement device, the enhancement device having a larger contact surface area than the attachment end of the replacement lead;

attaching the enhancement device to the housing such that the contact surface area of the enhancement device provides mechanical reinforcement to the replacement lead;

etching an attachment region out of the housing, the attachment region located adjacent to a conductive element of the housing, the conductive element providing a conductive pathway through the housing;

aligning the enhancement device with the attachment region; and bonding the enhancement device to the conductive element with an electrically conductive adhesive.

2. The method of claim 1 further including the step of overcoating the replacement lead and the enhancement device with a structural adhesive.

3. The method of claim 1 further including the step of etching the attachment region around a via.

4. The method of claim 3 further including the step of etching a ceramic material out of the housing.

5. The method of claim 1 further including the step of etching the attachment region around an internal leadframe.

6. The method of claim 5 further including the step of etching a plastic material out of the housing.

7. The method of claim 1 further including the step of welding the attachment end of the replacement lead to a gold plated molybdenum tab.

8. The method of claim 7 further including the step of welding the attachment end of the replacement lead to the tab.

9. A method for attaching a replacement lead enhancement device to an integrated microcircuit housing, the method comprising the steps of:

etching an attachment region out of the housing, the attachment region located adjacent to a conductive element of the housing, the conductive element providing a conductive pathway through the housing;

aligning the enhancement device with the attachment region; and bonding the enhancement device to the conductive element with an electrically conductive adhesive.

10. The method of claim 9 further including the step of overcoating the replacement lead and the enhancement device with a structural adhesive.

11. The method of claim 9 further including the step of etching the attachment region around a via.

12. The method of claim 11 further including the step of etching a ceramic material out of the housing.

13. The method of claim 9 further including the step of etching the attachment region around an internal leadframe.

14. The method of claim 13 further including the step of etching a plastic material out of the housing.

* * * * *